United States Patent [19]
Mårtensson et al.

[11] Patent Number: 5,842,877
[45] Date of Patent: Dec. 1, 1998

[54] SHIELDED AND IMPEDANCE-MATCHED CONNECTOR ASSEMBLY, AND ASSOCIATED METHOD, FOR RADIO FREQUENCY CIRCUIT DEVICE

[75] Inventors: Lars Gunnar Mårtensson, Stockholm; Stefan Karl Sture Cederblad, Cederblad; Hans Christer Arne Lundin, Stockholm, all of Sweden

[73] Assignee: Telefonaktiebolaget L M Ericsson, Stockholm, Sweden

[21] Appl. No.: 768,179

[22] Filed: Dec. 16, 1996

[51] Int. Cl.$^6$ ............................................. H01R 4/58
[52] U.S. Cl. ......................................................... 439/91
[58] Field of Search ........................... 439/66, 63, 91, 439/581, 83, 876; 29/830, 831, 852

[56] References Cited

U.S. PATENT DOCUMENTS

| | | | |
|---|---|---|---|
| 4,890,155 | 12/1989 | Miyagawa et al. | 357/74 |
| 5,302,923 | 4/1994 | Mason et al. | 333/33 |
| 5,586,006 | 12/1996 | Seyama et al. | 361/719 |

FOREIGN PATENT DOCUMENTS

| | | |
|---|---|---|
| 0 069 102 A2 | 1/1983 | European Pat. Off. . |
| 0 318 311 A2 | 5/1989 | European Pat. Off. . |
| 61-005549 | 1/1986 | Japan . |
| 04 000802 | 1/1992 | Japan . |
| 04 340732 | 11/1992 | Japan . |
| 08 236894 | 9/1996 | Japan . |
| 2 303 747 | 2/1997 | United Kingdom . |
| WO 96/27282 | 9/1996 | WIPO . |

Primary Examiner—Neil Abrams
Assistant Examiner—Barry M. L. Standig
Attorney, Agent, or Firm—Jenkens & Gilchrist, P.C.

[57] ABSTRACT

A connector assembly, and associated method, connects a first circuit element portion and a second circuit element portion of a radio frequency circuit device together. Isolated conduction of a radio frequency signal between the first and second circuit element portions is provided. Appropriate selection of the relative dimensions of the connector assembly permits the characteristic impedance of the connector assembly to match the characteristic impedance of the circuit element portions.

20 Claims, 3 Drawing Sheets

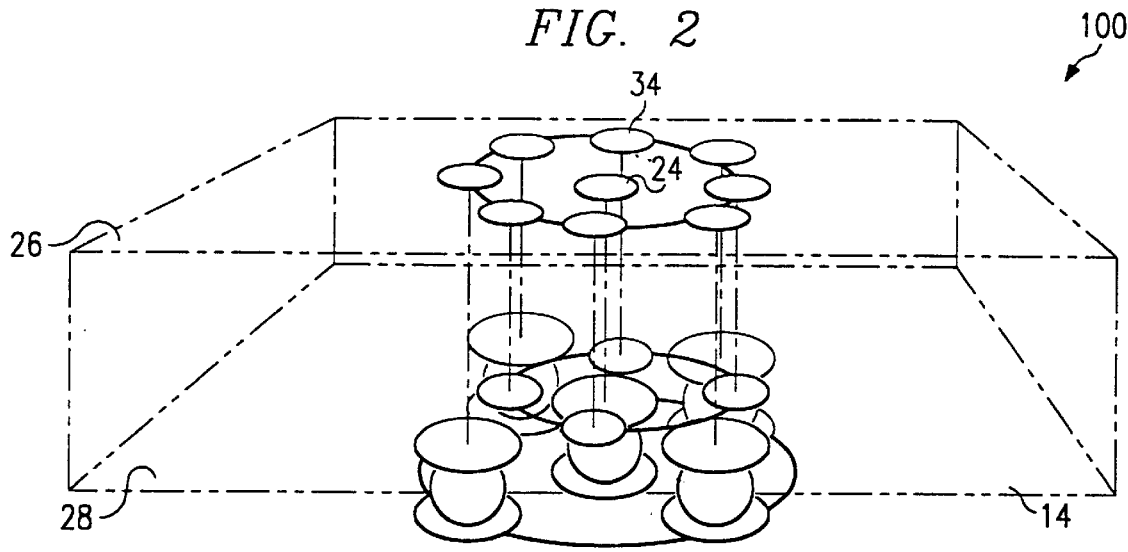
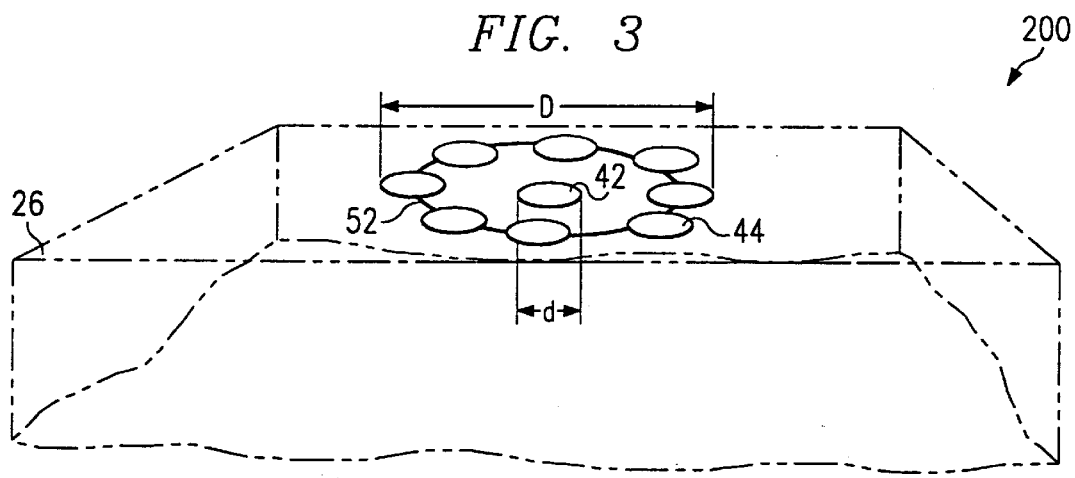

SHIELDED AND IMPEDANCE-MATCHED CONNECTOR ASSEMBLY, AND ASSOCIATED METHOD, FOR RADIO FREQUENCY CIRCUIT DEVICE

The present invention relates generally to electronic circuit devices, such as ceramic, surface-mounted circuit devices, operable at radio frequencies. More particularly, the present invention relates to a connector assembly, and an associated method, for forming an isolated and matched connection between circuit portions of the electronic circuit device.

The isolation provided by the connection attenuates emanations of electromagnetic energy which is generated during operation of the electronic circuit device. Electromagnetic energy generated, for example, as a byproduct of conduction of a radio frequency signal through the connection is attenuated so as not to interfere with conductors or components.

The matching provided by the connection reduces signal losses which might otherwise occur if the connection were not of an impedance matched with that of the circuit portions.

BACKGROUND OF THE INVENTION

Various types of electronic devices are operable at radio frequencies. Some of such electronic devices are operable to receive signals of radio frequencies, others of such electronic devices are alternately, or are also, operable to generate radio frequency signals.

A problem characteristic of an electronic device operated at radio frequencies involves the generation of electromagnetic energy as a by-product of operation of the device. When a radio frequency signal is conducted through the device, such as between circuit portions thereof, electromagnetic energy is generated. Emanation of the electromagnetic energy generated as a by-product of normal operation of the electronic device, forms interference which might interfere with operation of other portions of the electronic device or with another electronic device.

A radio receiver is exemplary of an electronic device having component portions which utilize radio frequency signals during normal operation. Electromagnetic energy generated as a by-product of such radio frequency signals can cause interference, interfering with operation of the receiver. Such interference, sometimes also called crosstalk, reduces the quality of the operation of the receiver.

Increasingly, electronic circuit devices are constructed to be operable at higher frequencies. The frequency of the electromagnetic energy generated responsive to conduction of radio frequency signals at the higher frequencies has fundamental components which are also of the higher frequencies. The detrimental effects of interference resulting from emanations of the electromagnetic energy are sometimes even more detrimental when the energy has fundamental components which are also of the higher frequencies.

Also increasingly, electronic circuits have become miniaturized. With such increased miniaturization, electronic circuits and the devices forming such circuits can be placed in closer proximity to one another. Interference caused by emanations of electromagnetic energy is dependent upon distance from the source of the energy. Therefore, increased miniaturization causes greater numbers of circuit devices more likely to be affected more significantly by the electromagnetic energy.

Circuit devices operable at relatively high radio frequencies are sometimes constructed of ceramic materials. Such devices are sometimes also surface-mounted upon a substrate, such as a printed circuit board. Layers of ceramic materials are cascaded upon one another. The layers of ceramic material are constructed in manners to contain, sometimes large numbers of, electronic components. The components are coupled together to form operating, electronic circuits. Connectors, such as signal vias, thick-film coatings or other connectors, connect such components together. Electromagnetic energy generated as a by-product of the conduction of an RF signal through such connector might interfere with operation of other components comprised in the layers of ceramic materials. And, when connectors are required to interconnect various circuit components disposed on, or in, the ceramic layers, mismatching of the impedance of the connector with the impedances of the circuit elements results in signal loss. Such signal loss also interferes with proper operation of the circuit device.

A manner by which to form a connection between circuit portions of an electronic circuit of improved isolation characteristics would be advantageous. A manner also by which to form a connection between the circuit portions of the electronic circuit in which the connection is matched with the electronic circuit would also be advantageous.

It is in light of this background information related to electronic circuit devices operable at radio frequencies that the significant improvements of the present invention have evolved.

SUMMARY OF THE INVENTION

The present invention advantageously provides a connector assembly, and an associated method, for electrically interconnecting portions of an electronic circuit. An isolated and matched connection between the circuit portions of the electronic circuit device is formed.

Because the connection formed between the circuit portions is isolated, electromagnetic energy generated as a by-product of conduction of a radio frequency signal through the connector assembly is attenuated. Thereby, the levels of electromagnetic energy which might otherwise interfere with operation of the electronic circuit device are reduced.

Because the connection formed between the circuit portions is matched to the impedance of the electronic circuit device, signal loss which might otherwise occur if the connection were mismatched is reduced. Thereby, circuit performance of the electronic circuit device is improved.

In one aspect of the present invention, the connector assembly forms a connection between a surface-mounted circuit element and a printed circuit board, or other substrate. A centrally-positioned solder-ball is positioned between the circuit element and the printed circuit board. The centrally-positioned solder-ball forms a signal path between the circuit element and a signal line formed upon the printed circuit board. A plurality of circumferentially-positioned solder-balls are radially-separated from the centrally-positioned solder-ball. The circumferentially-positioned solder-balls substantially surround the centrally-positioned solder-ball. The plurality of circumferentially-positioned solder-balls attenuate emanations of electromagnetic energy generated during conduction of a radio frequency signal between the circuit element and the signal line of the printed circuit board through the centrally-positioned solder-ball. And, externally-generated electromagnetic energy is attenuated so as not to interfere with the signal conducted through the centrally-positioned solder-ball.

In another aspect of the present invention, a connection is formed between first and second circuit portions formed above and beneath a layer of isolating dielectric material. A centrally-positioned via is formed to extend through the layer of the isolating dielectric material. A centrally-positioned via forms a signal path for the conduction of a radio frequency signal between the first and second circuit portions. A plurality of circumferentially-positioned vias are formed to extend through the layer. The circumferentially-positioned vias are radially-separated from the centrally-positioned via and are positioned to substantially enclose the centrally-positioned via in radially-extending directions therefrom. The plurality of circumferentially-positioned vias prevent emanations of electromagnetic energy generated during conduction of a radio frequency signal along the centrally-positioned via therebeyond. Thereby, the connection formed between the first and second circuit layers is isolated. Electromagnetic energy generated as a by-product of conduction of the radio frequency signal through the centrally-positioned via is attenuated and therefore, interferes less with operation of other portions of the circuit device. Externally-generated electromagnetic energy similarly is attenuated and thereby interferes less with conduction of the signal through the centrally-positioned via.

In another aspect of the present invention, the connector assembly connects first and second circuit portions which are cascaded upon one another. A centrally-positioned coating of electrically-conductive material is positioned to interconnect signal lines of the two circuit portions. The centrally-positioned coating forms a signal path for permitting the conduction of a radio frequency signal between the signal paths of the two circuit portions. A plurality of circumferentially-positioned coatings of electrically-conductive material are formed between the two circuit portions. The circumferentially-positioned coatings are radially-separated from the centrally-positioned coating and substantially surround the centrally-positioned coating. The circumferentially-positioned coatings reduce emanations of electromagnetic energy generated during conduction of a radio frequency signal through the signal path formed of the centrally-positioned coating. The coatings of the electrically-conductive material are, for example, created by a thick-film process. Because the circumferentially positioned coatings absorb the electromagnetic energy generated during conduction of the radio frequency signal through the centrally-positioned coating, the electromagnetic energy is attenuated and causes less interference with operation of other portions of the circuit device. Externally-generated electromagnetic energy similarly is attenuated and thereby interferes less with conduction of the signal through the centrally-positioned via.

In another aspect of the present invention, a centrally-positioned conductive element, positioned to form a signal path between first and second circuit portions, is of a first selected diameter. The centrally-positioned conductive element forms a signal path permitting the conduction of a radio frequency signal between the first and second circuit element portions. A plurality of circumferentially-positioned conductive elements are positioned about the centrally-positioned conductive element and are radially spaced-apart therefrom. The plurality of circumferentially-positioned conductive elements together substantially enclose the centrally-positioned conductive element in the radially-extending directions therefrom. The circumferentially-positioned conductive elements form a radial enclosure defined by a second selected diameter. The first and second selected diameters are determinative of a characteristic impedance of the connector assembly formed of the centrally-positioned and circumferentially-positioned conductive elements. The first and second selected diameters are selected such that the connector assembly is of a characteristic impedance to match the impedance of the circuit element portions.

In these and other aspects, therefore, a connector assembly connects together a first circuit element portion and a second circuit element portion of a radio frequency circuit device. The connector assembly permits isolated conduction of a radio frequency signal between the first and second circuit element portions. A centrally-positioned conductive element is positioned between the first circuit element portion and the second circuit element portion and forms a signal path for the conduction of the radio frequency signal between the first and second circuit element portions. A plurality of circumferentially-positioned conductive elements are positioned about the centrally-positioned conductive element and are spaced-apart therefrom. The plurality of circumferentially-positioned conductive elements together substantially enclose the centrally-positioned conductive element in radially-extending directions therefrom. The circumferentially-positioned conductive elements at least reduce emanation of electromagnetic energy generated during conduction of the radio frequency signal along the signal path formed of the centrally-positioned conductive element.

A more complete appreciation of the present invention and the scope thereof can be obtained from the accompanying drawings which are briefly summarized below, the following detailed description of the presently-preferred embodiments of the invention, and the appended claims.

BRIEF DESCRIPTION OF THE DRAWINGS

FIG. 2 illustrates a perspective view of the connector assembly of another embodiment of the present invention.

FIG. 3 illustrates a cutaway, perspective view of the connector assembly of another embodiment of the present invention.

FIG. 5 illustrates a method flow diagram listing the method steps of a method of an embodiment of the present invention.

DETAILED DESCRIPTION

Figure 1:
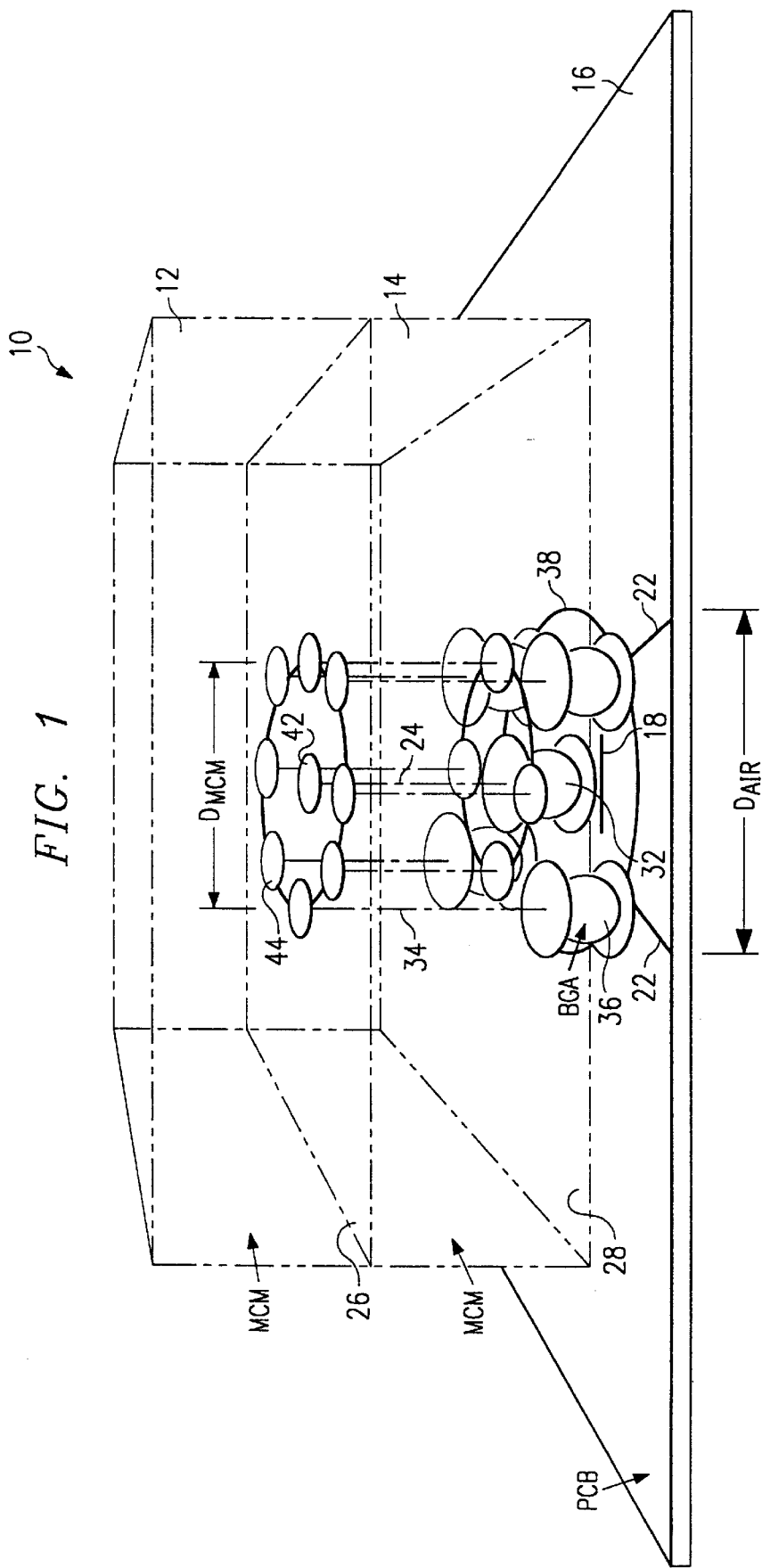
FIG. 1 illustrates a perspective view of a circuit device in which an embodiment of the present invention forms a portion.

Referring first to FIG. 1, a radio frequency circuit device, shown generally at 10, of which an embodiment of the present invention forms a portion is shown. The circuit device 10 is exemplary in nature. Embodiments of the present invention may similarly form portions of other circuit devices of other constructions.

The exemplary circuit device 10 includes multiple layers of isolating dielectric materials, here formed of ceramic materials. Two layers 12 and 14 are illustrated in FIG. 1. The layer 12 is cascaded upon the layer 14. A plurality of circuit elements (not shown) which together form at least portions of an electrical circuit are formed on one or more face surfaces of the layers 12 and 14.

In one embodiment, the circuit device 10 forms portions of a radio receiver, such as a radio receiver forming a portion of a cellular communication system. The layer 14, together with the layer 12 cascaded thereupon, is surface-mounted upon a printed circuit board 16. Circuit lines, including a signal line 18 and ground lines 22, are formed upon the printed circuit board 16, in conventional manner.

In the illustrated embodiment, a single signal line 24 is represented functionally to extend vertically through the layer 14 between a top face surface 26 of the layer 14 and a bottom face surface 28 thereof. A signal line 24 is formed of a via extending through the layer. The via is a thru-hole bored, or otherwise formed, and filled with an electrically-conductive material.

A solder-ball 32 is positioned between the signal line 24 and the signal line 18 formed upon the printed circuit board 16. The solder-ball 32 forms a signal path permitting conduction of a radio frequency signal between the signal line 18 and the signal line 24.

A plurality, here eight, of ground lines 34, are also functionally illustrated in the Figure. The lines 34 also extend between the top and bottom face surfaces 26 and 28 of the layer 14. Each of the ground lines 34 is radially-separated from the signal line 24. In the illustrated embodiment, each of the ground lines 34 is separated from the signal line 24 by the same radial distance, thereby to be positioned about a common circumference. The ground lines 34 substantially surround the signal line 18 in radial directions therefrom. Thereby, the ground lines 34 form a shield about the signal line 24.

Solder-balls 36 are positioned between the ground lines 34 of the layer 14 and the ground lines 22 formed on the circuit board 16. The solder-balls 36 electrically interconnect the ground lines 34 with the ground lines 22. In manners analogous to the radially-separated positions at which the ground lines 34 are formed relative to the signal line 18, the solder-balls 36 are also radially-separated from the solder-ball 32. In like fashion, therefore, to the manner by which the ground lines 34 substantially surround the signal line 18, the solder-balls 36 substantially surround the solder-ball 32. Thereby, the solder-balls 36 form a shield about the solder-ball 32.

During operation of the circuit device 10 in which a radio frequency signal is conducted along the signal line 18, through the solder-ball 32, and along the signal line 24, electromagnetic energy is generated as a byproduct of such conduction. Because of the shield formed by the positioning of the ground lines 34 to substantially surround the signal line 18 and of the solder-balls 36 to substantially surround the solder-balls 32, the electromagnetic energy is shielded by such ground lines and solder-balls. The electromagnetic energy is attenuated and interference which might otherwise occur as a result of the emanation of the electromagnetic energy is substantially reduced. Electromagnetic energy generated elsewhere is analogously attenuated and interferes less with conduction of the radio frequency signal.

In the illustrated embodiment, the solder-balls 36 are further electrically-connected theretogether by an electrically-conductive material 38, such as a solder material. Such electrically-conductive material 38 insures that each of the solder-balls 36 and the ground lines 34 to which respective ones of the solder-balls are coupled are maintained at a common potential. The electrically-conductive material 38 also completely surrounds the solder-ball 32 in the radial directions therefrom.

A coating of electrically-conductive material is selectively formed upon the top face surface 26 of the layer 14 of the isolating dielectric material. The coating is applied, for example, by a thick-film plating process. The coating includes a centrally-positioned conductive portion 42 applied at a location at which the signal line 24 opens at the top face surface 26. Analogously, a plurality of circumferentially-positioned coatings of electrically-conductive material 44 are formed upon the top face surface 26 at the locations of the top face surface at which the ground lines 34 open at the top face surface. The coated portions 44 are each radially-separated from the coated portion 42 at a common distance from the coated portion 42, thereby to be circumferentially-positioned about the coated portion 42. Thereby, the coated portions 44 substantially surround the coated portion 42.

While not illustrated in the Figure, signal and ground lines, analogous to the signal and ground lines 24 and 34 forming portions of the layer 14, also extend through the layer 12. The coated portions 42 and 44 electrically interconnect such signal and ground lines, respectively, with corresponding ones of the signal and ground lines 24 and 34 extending through the layer 14. In such manner, a radio frequency signal can be conducted between the signal line 18, through the solder-ball 32, through the signal line 24, through the coated portion 42, and to a signal line extending through the layer 12. Because the solder-balls 36, ground lines 34, and coated portions 44 substantially surround the signal path formed through the circuit device 10, electromagnetic energy generated as a by-product of conduction of a radio frequency signal along the signal path is attenuated and is less likely to interfere with operation of circuit elements of the circuit device 10. Multiple numbers of layers, similar to the layers 12 and 14, can be cascaded in manners analogous to the layers 12 and 14. Signal paths can similarly be formed to extend through such additional layers of isolating dielectric material. And, circumferentially-positioned, electrically-conductive ground lines can be similarly formed to extend therethrough. Electromagnetic energy generated as a byproduct of conduction of a radio frequency signal along signal lines formed to extend through such additional circuit layers are attenuated by the shield formed of the ground lines positioned thereabout and radially-separated therefrom.

FIG. 2 illustrates a circuit device, shown generally at 100, of which an embodiment of the present invention also forms a portion. Here again, the device is formed of a layer, here layer 14, of an isolating, dielectric material, here formed of a ceramic material. A signal via forming a signal line 24 extends between a top face surface 26 and a bottom face surface 28. The signal via forming the signal line 24 is formed by boring, or otherwise forming, a thru-hole through the layer 14 and filling the thru-hole with an electrically-conductive material. A radio frequency signal applied to the signal line 24, such as at the top or bottom face surfaces 26 and 28 can thereby be conducted through the layer 14.

A plurality of ground vias forming ground lines 34 are also formed to extend through the layer 14. The vias forming the ground lines 34 are formed in manners analogous to the manner by which the signal via forming the signal line 24 is formed. The ground lines 34 are formed to be radially-separated from the signal line 24. Each of the ground lines 34 is radially-separated from the signal line 24 at substantially similar separation distances, thereby to be circumferentially-positioned around the signal line 24. In the exemplary embodiment, eight ground lines 34 are positioned around the signal line 24, thereby to substantially surround the signal line. Electromagnetic energy generated as a by-product of conduction of a radio frequency signal along the signal line 24 is attenuated by the ground lines 34. Interference which might otherwise be caused by the electromagnetic energy is substantially reduced because of such attenuation. While only a single signal line 24 is illustrated in the exemplary embodiment shown in FIG. 2, a large number of signal lines, and corresponding ground lines radially-separated therefrom, can be formed.

FIG. 3 illustrates a portion of a circuit device, here shown generally at 200, in which an embodiment of the present invention forms a portion. Here, the top face surface 26 of a layer 14 of isolating dielectric material is shown. Centrally-positioned coated portions 42 are formed on the top face surface 26 by, for example, a thick-film process. Each of the coated portions 42 is formed at an end portion of a signal line, such as the signal line 24 shown in FIGS. 1 and 2.

A plurality of coated portions 44 are analogously also formed upon the top face surface 26. The coated portions 44 are formed on the top face surface 26 corresponding to end-points of ground lines, such as the ground lines 34 shown in FIGS. 1 and 2. The coated portions 44 are circumferentially-positioned about the coated portions 42. The discrete coated portions 44 are connected together by way of a circumferentially-extending coating of electrically-conductive material. The circumferentially-extending coating 52 of the electrically-conductive material is also formed, for example, by a thick-film process.

Interference which might otherwise be caused by emanations of the electromagnetic energy are instead attenuated by the material radially-separated from the coated portion 42.

Figure 4:
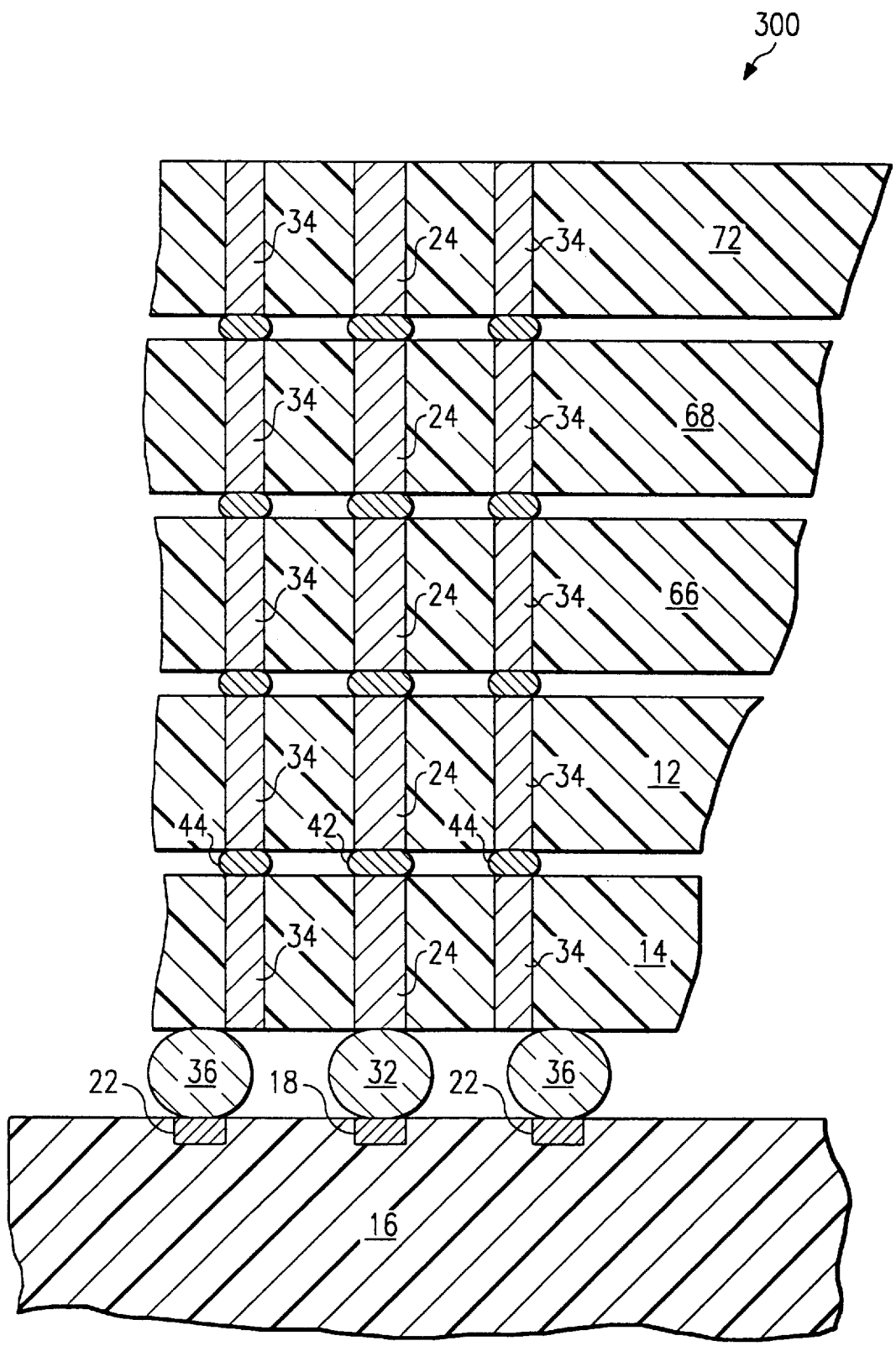
FIG. 4 illustrates a sectional view of a portion of a circuit device of which an embodiment of the present invention forms a portion.

FIG. 4 illustrates a circuit device 300 in which an embodiment of the present invention also forms a portion. The circuit device 300 includes cascaded, layers 14, 12, 66, 68 and 72 mounted upon a printed circuit board 16. The layers 14, 12, 66, 68, and 72 are formed of an isolating dielectric material.

A signal line 18 and ground lines 22 are formed upon the printed circuit board 16. Vias forming a signal line 24 and ground lines 34 are formed to extend through the circuit layer 14, as described previously with respect to the circuit device 100 shown in FIG. 1. A centrally-positioned solder-ball 32 interconnects the signal line 18 with the signal line 24. Similarly, circumferentially-positioned solder-balls 36 interconnect the ground lines 22 with the ground lines 34. A radio frequency signal can thereby be conducted along a signal path formed of the signal line 18, solder-ball 32, and signal line 24.

The circuit device 300 further includes a centrally-positioned coated portion 42 and circumferentially-positioned coated portions 44 formed between the layers 12 and 14. The coated portions 42 and 44 electrically interconnect the signal line 24 and the ground lines 34, respectively, with corresponding, and here similarly numbered, lines extending through the circuit layer 12.

In like fashion, coated portions 42 and 44 are formed to be positioned between the other cascaded layers of the circuit device 300. As illustrated, the coated portions 42 and 44 are positioned between the circuit layers 12 and 66, between the circuit layers 66 and 68, and between the circuit layers 68 and 72. The circuit layers 66, 68, and 72 also include signal and ground lines 24 and 34 extending therethrough. Electromagnetic energy generated as a by-product of conduction of a radio frequency signal along a signal path formed of the signal lines 24 and coated portions 42 is attenuated by the ground lines 34 and coated portions 44. Externally-generated electromagnetic energy is similarly attenuated so as not to interfere with conduction of a signal through the signal path formed to extend through the device.

FIG. 3 illustrates the relationship between the centrally-positioned coated portion 42 and the circumferentially positioned coated portions 44 and 52. The relationship between the solder balls 32 and 36 can similarly be illustrated. And, the relationship between the signal line 24 and ground lines 34 can be analogously illustrated.

The diameter of the coated portion 42 of a diameter, d. The radial enclosure formed of the coated portions 44 and 52 is defined by a Diameter, D. Appropriate selection of the respective diameters permits the characteristic impedance of the combined structure, here forming a connection between the lines 24 and 34 of adjacently-positioned layers. In similar fashion, the solder balls 32 and 36 form a connector assembly connecting lines 24 and 34 to the lines formed on the printed circuit board 16. Analogously, the lines 24 and 34 of a middle positioned layer permits interconnection of corresponding lines 24 and 34 of the circuit layers positioned above and beneath respectively, such middle positioned layer.

The coated portion 42 and the radially-extending enclosure are coaxially formed. Because of such coaxial nature, the assembly, defined of the just-noted manners, exhibits a characteristic impedance defined by the following equation:

$$Z_0 = (60/\sqrt{\epsilon_r}) ln(D/d)$$

As the equation indicates, the characteristic impedance, $Z_0$, of the connector assembly can be formed to be of any desired value by proper selection of the values of the respective diameters. For instance, if portions of the circuit device of which the connector assembly, however defined, is of a characteristic impedance of 50 ohms, suitable selection of the respective diameters permits the characteristic impedance of the connector assembly also to exhibit a characteristic impedance of 50 ohms. By matching the characteristic impedance, signal loss of the radio frequency signal conducted along a signal line extending through the circuit device is minimized.

FIG. 5 illustrates a method, shown generally at 80, listing the method steps of an embodiment of the present invention. The method 80 connects a first circuit element portion of a radio frequency circuit device together with a second circuit element portion to permit isolated conduction of a radio frequency signal between the first and second circuit element portions. First, and as indicated by the block 82, a centrally-positioned conductive element is positioned between the first circuit element portion and the second circuit element portion. The centrally-positioned conductive element forms a signal path for the conduction of the radio frequency signal between the first and second circuit element portions.

And, as indicated by the block 84, a plurality of circumferentially-positioned conductive elements are positioned about the centrally-positioned conductive element. Such circumferentially-positioned conductive elements are spaced-apart from the centrally-positioned conductive element. The circumferentially-positioned conductive elements together substantially enclose the centrally-positioned conductive element in radially-extending directions therefrom. The circumferentially-positioned conductive elements reduce emanations of electromagnetic energy generated during conduction of a radio frequency signal through the signal path formed of the centrally-positioned conductive element.

The connection provided by an embodiment of the present invention attenuates electromagnetic energy generated as a by-product of conduction of a radio frequency signal along a signal path. Externally-generated electromagnetic energy is similarly attenuated so as not to interfere with a radio frequency signal conducted along the signal path. The characteristic impedance of the connection can be selected to be of any desired impedance, thereby to permit the impedance of the connection to be matched with that of circuit portions of the circuit device, which are to be connected together. Thereby, signal loss of the conducted signal can also be minimized.

The previous descriptions are of preferred examples for implementing the invention, and the scope of the invention should not necessarily be limited by this description. The scope of the present invention is defined by the following claims.

What is claimed is:

1. In a radio frequency circuit device having a first circuit element portion and a second circuit element portion, an improvement of a connector assembly for connecting the first circuit element portion together with the second circuit element portion to permit shielded conduction of a radio frequency signal between the first and second circuit element portions, respectively, said connector comprising:
    a centrally-positioned conductive element positioned between the first circuit element portion and the second circuit element portion, said centrally-positioned conductive element for forming a signal path for the conduction of the radio frequency signal between the first and second circuit element portions, respectively, said centrally-positioned conductive element defining a first diametrical dimension; and
    a plurality of circumferentially-positioned conductive elements positioned about said centrally-positioned conductive element and spaced-apart therefrom, said plurality of circumferentially-positioned conductive elements together substantially enclosing said centrally-positioned conductive element in radially-extending directions therefrom, opposing ones of said plurality of circumferentially-positioned conductive elements defining a second diametrical dimension, the first diametrical dimension and the second diametrical dimension together determinative, at least in part, of a characteristic impedance of said centrally-positioned conductive element and said plurality of circumferentially-positioned conductive elements, the first and second diametrical dimensions, respectively, selected such that the characteristic impedance is of a selected value.

2. The connector assembly of claim 1 wherein at least selected ones of said plurality of circumferentially-positioned conductive elements are spaced-apart from one another, said connector assembly further comprising a conductive, circumferential connector positioned about said centrally-positioned conductive element and radially-separated therefrom, said conductive, circumferential connector for electrically connecting said plurality of circumferentially-positioned conductive elements theretogether at a common potential and for completely enclosing said centrally-positioned conductive element in the radially-extending directions therefrom.

3. The connector assembly of claim 1 wherein the first circuit element portion and the second circuit element portion are separated by a layer of isolating dielectric material and wherein said centrally-positioned conductive element comprises a centrally-positioned via formed to extend through the layer of the isolating dielectric material.

4. The connector assembly of claim 3 wherein said plurality of circumferentially-positioned conductive elements comprise circumferentially-positioned vias formed to extend through the layer of the isolating dielectric material.

5. The connector assembly of claim 1 wherein the first circuit element portion comprises a surface-mountable circuit device, wherein the second circuit element portion comprises a substrate upon which the surface-mountable circuit device is mountable, and wherein said centrally-positioned conductive element comprises a centrally-positioned solder-ball positioned between the surface-mountable circuit device and the substrate.

6. The connector assembly of claim 5 wherein said plurality of circumferentially-positioned conductive elements comprise circumferentially-positioned solder-balls positioned between the surface-mountable circuit device and the substrate.

7. The connector assembly of claim 6 wherein at least selected ones of said plurality of circumferentially-positioned solder-balls are spaced-apart from one another, and said connector assembly further comprises a conductive, circumferential connector positioned about said centrally-positioned solder-ball and radially-separated therefrom, said conductive circumferential connector for electrically-connecting said plurality of circumferentially-positioned conductive elements theretogether at a common potential and for completely enclosing said centrally-positioned conductive element in the radially-extending directions therefrom.

8. The connector assembly of claim 6 wherein said centrally-positioned solder-ball is of a selected centrally-positioned solder-ball diameter which defines the first diametrical dimension, the plurality of circumferentially-positioned solder-balls are selectively positioned to form a substantially-enclosed area of a circumferentially-positioned solder-ball diameter which defines the second diametrical dimension, the first diametrical dimension and the second diametrical dimension together selected to select the characteristic impedance.

9. The connector assembly of claim 1 wherein the first circuit portion and the second circuit portion are positioned in cascade upon one another and wherein said centrally-positioned conductive element comprises a centrally-positioned coating of an electrically-conductive material.

10. The connector assembly of claim 9 wherein said plurality of circumferentially-positioned conductive elements comprise circumferentially-positioned coatings of an electrically-conductive material.

11. The connector assembly of claim 10 wherein said centrally-positioned coating and said circumferentially-positioned conductive elements comprise thick-film coatings.

12. In a radio frequency circuit device having a first circuit element portion and a second circuit element portion, an improvement of a connector assembly for connecting the first circuit element portion together with the second circuit element portion to permit conduction of a radio frequency signal between the first and second element portions, respectively, said connector comprising:
    a centrally-positioned solder-ball positioned between the first circuit element portion and the second circuit element portion, said. centrally-positioned solder-ball for forming a signal path for the conduction of the radio frequency signal between the first and second circuit element portions, respectively; and
    a plurality of circumferentially-positioned solder-balls positioned about said centrally-positioned solder-ball and spaced-apart therefrom, said plurality of circumferentially-positioned solder balls together substantially enclosing said centrally-positioned solder-ball in radially-extending directions therefrom, distances separating said plurality of circumferentially-positioned solder-balls and said centrally-positioned solder-ball determinative, at least in part, of a characteristic impedance of said centrally-positioned solder-ball together with said plurality of circumferentially-positioned solder-balls, respectively, the distances selected such that the characteristic impedance is of a selected value.

13. In a method for conducting a radio frequency signal in a radio frequency circuit device having a first circuit element portion and a second circuit element portion, an improvement of a method for connecting the first circuit element portion together with the second circuit element portion to permit isolated conduction of the radio frequency signal between the first and second circuit element portions, respectively, said method comprising the steps of:

positioning a centrally-positioned conductive element between the first circuit element portion and the second circuit element portion, said centrally-positioned conductive element for forming a signal path for the conduction of the radio frequency signal between the first and second circuit element portions, respectively, the centrally-positioned conductive element defining a first diametrical dimension; and positioning a plurality of circumferentially-positioned conductive elements about said centrally-positioned conductive element and spaced-apart therefrom, said plurality of circumferentially-positioned conductive elements together substantially enclosing said centrally-positioned conductive element in radially-extending directions therefrom, opposing ones of said plurality of circumferentially-positioned conductive elements defining a second diametrical dimension, the first diametrical dimension and the second diametrical dimension together determinative, at least in part, of a characteristic impedance of said centrally-positioned conductive element and said plurality of circumferentially-positioned conductive elements, the first and second diametrical dimensions, respectively, selected such that the characteristic impedance is of a selected value.

14. A circuit assembly operable at radio frequencies, said circuit assembly comprising:

a substrate having at least a signal pathline and a ground pathline formed thereon;

at least a first layer of isolating dielectric material having a top face surface and a bottom face surface, the bottom face surface mounted upon said substrate;

a first signal via formed to extend between the bottom and top face surfaces, respectively, of said first layer of isolating dielectric material, said first signal via for conducting a radio frequency signal between the bottom and top face surfaces of said first layer of isolating dielectric material, said first signal via defining a first diametrical dimension;

a plurality of ground vias formed to extend between the bottom and top face surfaces, respectively, of said first layer of isolating dielectric material, said plurality of ground vias formed circumferentially about said first signal via and positioned radially therefrom, thereby to substantially enclose said first signal via, said plurality of ground vias for reducing emanations of electromagnetic energy generated during conduction of the radio frequency signal along said first signal via in radial directions beyond said plurality of ground vias, opposing ones of said plurality of circumferentially-positioned around vias defining a second diametrical dimension, the first diametrical dimension and the second diametrical dimension together determinative, at least in part, of a characteristic impedance of said first signal via and said plurality of ground vias, the first and second diametrical dimensions, respectively, selected such that the characteristic impedance is of a selected value;

a centrally-positioned solder-ball positioned between said first signal via and the signal pathline of said substrate, said centrally-positioned solder-ball for conducting the radio frequency signal between the signal pathline of said substrate and said first signal via; and a plurality of circumferentially-positioned solder-balls positioned between, and electrically connecting, the ground pathline formed on said substrate and said plurality of ground vias extending through said first layer of isolating dielectric material, said plurality of circumferentially-positioned solder-balls extending in radial directions from said centrally-positioned solder-ball, thereby to substantially enclose said centrally-positioned solder-ball, said plurality of circumferentially-positioned solder-balls for shielding said centrally-positioned solder-ball during conduction of the radio frequency signal along said centrally-positioned solder-ball during conduction of the radio frequency signal between the signal pathline of said substrate and said first signal via.

15. An electronic manufacture for providing shielding and for minimizing signal loss, said electronic manufacture comprising:

a first circuit portion having a first impedance;

a second circuit portion having a second impedance, said second circuit portion connected to said first circuit portion, said second circuit portion including a centrally-positioned conductive element that defines a first preselected diametrical dimension, said second circuit portion also including a plurality of circumferentially-positioned conductive elements that substantially surround said centrally-positioned conductive element and that together define a second preselected diametrical dimension;

wherein said first and second preselected diametrical dimensions are selected such that said second impedance substantially matches said first impedance.

16. The electronic manufacture of claim 15, wherein said plurality of circumferentially-positioned conductive elements are spaced-apart from said centrally-positioned conductive element and together substantially enclose said centrally-positioned conductive element in radially-extending directions therefrom.

17. The electronic manufacture of claim 15, wherein both said centrally-positioned conductive element and said plurality of circumferentially-positioned conductive elements comprise solder-balls.

18. The electronic manufacture of claim 15, wherein both said centrally-positioned conductive element and said plurality of circumferentially-positioned conductive elements comprise vias.

19. The electronic manufacture of claim 15, wherein both said centrally-positioned conductive element and said plurality of circumferentially-positioned conductive elements comprise coatings of an electrically-conductive material.

20. The electronic manufacture of claim 15, wherein said second circuit portion further includes a conductive, circumferential connector that electrically interconnects said plurality of circumferentially-positioned conductive elements to thereby maintain said plurality of circumferentially-positioned conductive elements at substantially a single potential.

* * * * *

UNITED STATES PATENT AND TRADEMARK OFFICE
CERTIFICATE OF CORRECTION

PATENT NO. : 5,842,877
DATED : December 1, 1998
INVENTOR(S) : Mårtensson et al.

It is certified that error appears in the above-identified patent and that said Letters Patent is hereby corrected as shown below: On the title page:

| | |
|---|---|
| [75], Inventors | Replace "Cederblad, Cederblad" With --Cederblad, Södertälje-- |
| [21], Appl. No. | Replace "768,179" With --08/768,179-- |
| Column 5, line 44 | Replace "byproduct" With --by-product-- |
| Column 6, line 36 | Replace "byproduct" With --by-product-- |
| Column 10, line 55 | Replace "said." With --said-- |
| Column 11, line 64 | Replace "around" With --ground-- |

Signed and Sealed this

Fifteenth Day of May, 2001

Attest:

NICHOLAS P. GODICI

Attesting Officer     Acting Director of the United States Patent and Trademark Office